United States Patent [19]

Bisczat et al.

[11] Patent Number: 4,582,381
[45] Date of Patent: Apr. 15, 1986

[54] ELECTRICAL INTERLOCK

[75] Inventors: John J. Bisczat; Thomas M. Paulson, both of Lexington, Ky.

[73] Assignee: International Business Machines Corporation, Armonk, N.Y.

[21] Appl. No.: 645,126

[22] Filed: Aug. 28, 1984

[51] Int. Cl.[4] .......................................... H01R 13/631
[52] U.S. Cl. .................................. 339/82; 339/75 R; 339/91 R
[58] Field of Search ............. 339/75 R, 75 M, 75 MP, 339/91 R, 36, 37, 82

[56] References Cited

U.S. PATENT DOCUMENTS

| 114,782 | 5/1871 | Engelbrecht | 292/177 |
|---|---|---|---|
| 1,818,366 | 8/1931 | Vargo | 292/177 |
| 2,202,916 | 6/1940 | Mussa | 292/177 |
| 3,388,938 | 6/1968 | Peterson | 292/177 |
| 3,634,732 | 1/1972 | Finger et al. | 339/75 R |
| 3,660,798 | 5/1972 | Marzec | 339/36 |
| 3,728,586 | 4/1973 | Inhelder et al. | 339/37 |
| 3,917,372 | 11/1975 | Selinko | 339/75 M |
| 4,118,133 | 10/1978 | Kupfer | 403/24 |

Primary Examiner—John McQuade
Attorney, Agent, or Firm—William J. Dick

[57] ABSTRACT

In a machine (10) such as electronic typewriters having a functional package (30) which contain electronic components (31) and (21) respectively, an interlock (13a, 40, 50) inhibits the plugging in and removal of the functional package (30) without removing the plug end (13a) of a line cord (13) from the receptacle (14) on the machine (10). In the receptacle (14) associated with the plug end (13a) of the line cord is the distal end portion (41) of a biased bellcrank (40). The functional package contains a locking bar (50) which extends horizontally of the package (30). Upon insertion of the power cord plug end (13a) into the housed receptacle (14) the bellcrank (40) is caused to rotate engaging the lock bar (50) by passing through an opening (36a) on one side (37a) of the functional package (30). Upon engagment of the locking bar (50) by the bellcrank (40), the locking bar (50) is displaced through an opening (36b) in the opposite side of the functional package (30), and the locking bar (50) moves into locking position in the adjacent aperture (47) of the machine. In this manner, movement of the functional package (30), relative to the machine (10), is inhibited by the locking action of the interlock making it impossible to unplug the functional package (30) without removing power from the machine. The remote or extended end of the bellcrank, in a like manner, by itself prevents the insertion of the functional package (30) by engagement of the lower end of the functional package (30) against the terminal or remote end portion (45) of the bellcrank (40), if insertion of the functional package (30) is attempted without removal of the plug end (13a) from the receptacle (14).

7 Claims, 5 Drawing Figures

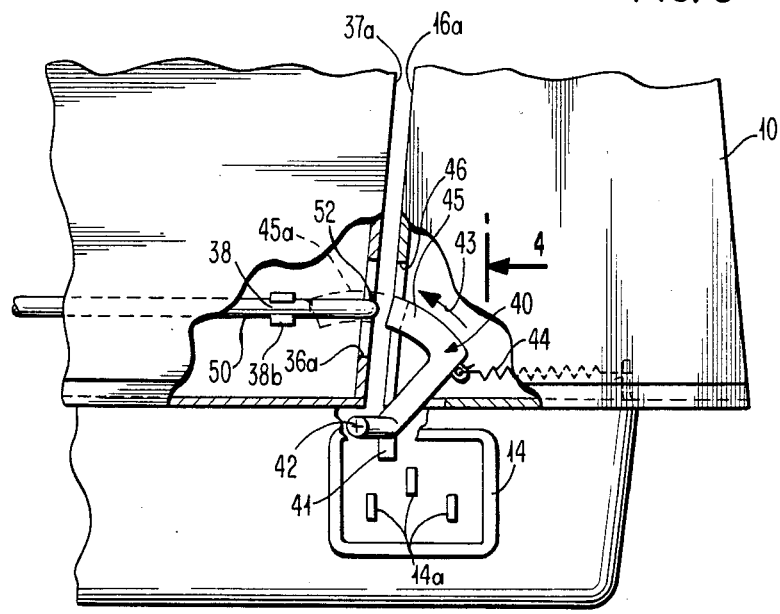
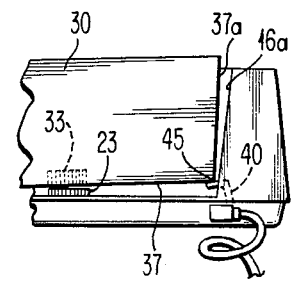
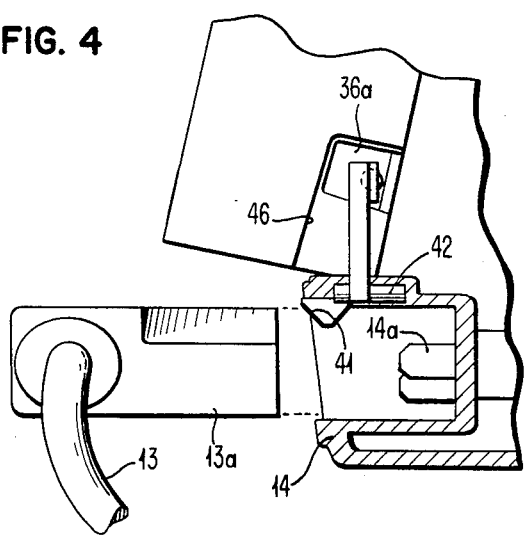

ELECTRICAL INTERLOCK

DESCRIPTION

1. Technical Field of the Invention

The present invention relates to a machine electrical interlock and more particularly relates to an interlock to prevent electrical damage to either a pluggable functional package containing electronic components, or to electronic components contained in the machine, either or both of which may be damaged by plugging or unplugging the functional package with power on the machine.

2. Background Art

The prior art is replete with electrical interlocks to prevent the removal of the cover of a machine without turning off the power and unplugging the device from the power source, notably a wall socket etc. Typical of such machines is a television set in which when the rear cover is removed, the circuit is broken by removing the line cord along with the rear cover to which it is attached. More recently, with the advent of electronic packages which are pluggable into a machine without removal of the covers of the machine, it is often mandatory that the package, (for the sake of both the electronic components therein as well as the electronic components contained in the machine) be inserted and removed with power off. Depsite labels warning that the package may be unplugged or reinserted only with power off, if often happens that during the lifetime of the product, somebody forgets and the package is removed and/or inserted with power on the machine. If the operator is fortunate, no damage will incur.

However, oft times the insertion or removal of the functional package with power on can cause the occurrence of voltage spikes due to excessive momentary loads causing damage to the functional package and/or the electronic devices in the associated machine.

The present invention circumscribes this problem by insuring that the power cord is removed from the machine before the functional package can be removed or inserted into the machine.

DISCLOSURE OF THE INVENTION

In view of the above, it is a principle advantage of the present invention that the electrical interlock inhibits electronic component destruction by forcing removal of the line cord prior to either plugging in the functional package or removing the same.

In this connection, the primary power receptacle in the machine includes a housing and an opening in the upper portion thereof for receipt of an actuator, in the present instance a biased bell crank. The functional package, in the present instance, is to be seated in the back of a machine containing electronic components such as a computer. The functional package also contains electronic components and is plugged into a multiple card edge device (for example) in the machine for signals in and out and powering of the same. If the line or power cord is inserted prior to attempting insertion of the functional package, the bellcrank is moved into a position to prevent the insertion of the functional package. The functional package contains a lock bar which extends horizontally across the package. Upon insertion of the functional package into the machine and the power cord into the housed receptacle, the bellcrank is caused to rotate engaging the lock bar by passing through an opening on one side of the package. Upon engagement of the locking bar by the bellcrank, and continued rotation thereof, the locking bar is displaced through an opening in the opposite side of the functional package, and into locking position in the adjacent part of the machine. In this manner, movement of the functional package, relative to the machine, is inhibited by the locking action of the interlock making it impossible to unplug the functional package without removing power from the machine by removing the line cord from the machine.

Other advantages of the apparatus of the present invention may be realized by considering the following detailed description and claims taken in conjunction with the drawings below described.

DRAWING DESCRIPTION

FIG. 3 is an enlarged fragmentary rear elevational view, partially in section, illustrating schematically the position of a portion of the electrical interlock of the present invention;

FIG. 4 is an enlarged fragmentary sectional view taken along line 4—4 of FIG. 3, and illustrating a typical line cord plug and its relationship to a portion of the apparatus of the electrical interlock of the present invention; and FIG. 5 is a reduced size, fragmentary rear elevational view illustrating schematically the position of a portion of the interlock of the present invention in place to inhibit the plugging of the functional pack into the machine.

DETAILED DESCRIPTION OF THE INVENTION

Figure 1:
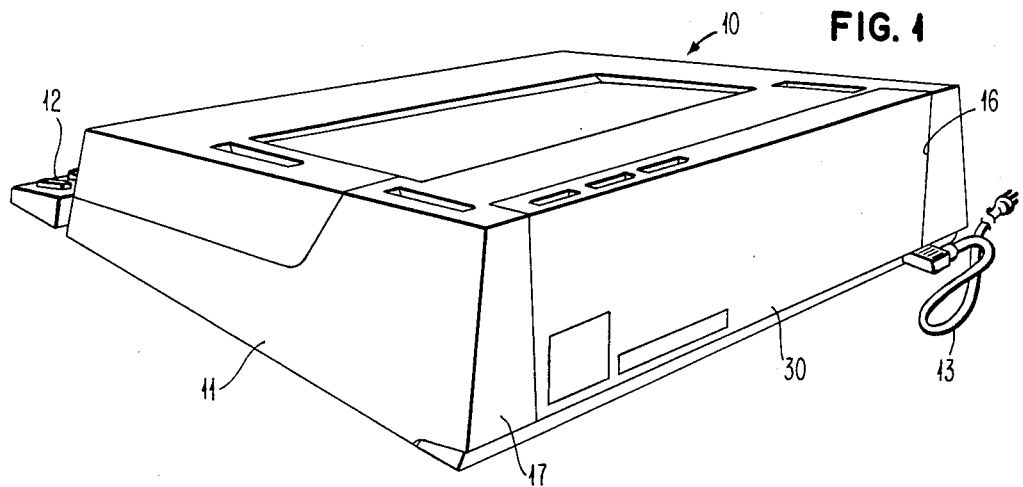
FIG. 1 is a perspective view of an exemplary machine incorporating the electrical interlock of the present invention.
Figure 2:
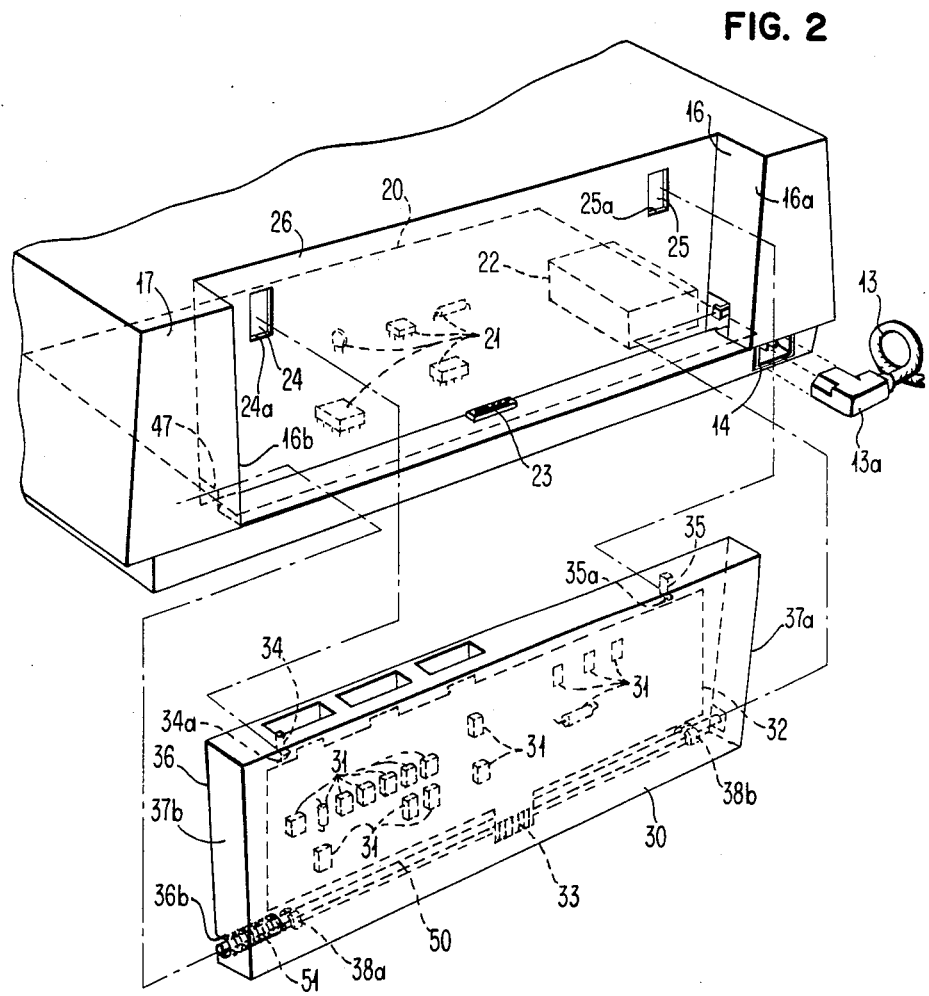
FIG. 2 is a fragmentary perspective view illustrating a pluggable package removed from the machine of FIG. 1 to which it is normally attached.

Referring now to the drawings, and especially FIG. 1 thereof, a machine, in the illustrated instance an electronic typewriter 10, is illustrated therein. As shown, the machine or electronic typewriter 10 generally includes a cover 11, keyboard 12 and is adapted for conventional typing, the machine being powered as through a line or power cord 13. In a recess or cavity 16 in the rear 17 of the machine is positioned a functional package or pack 30, the functional package 30 being pluggable into and out of the cavity 16. As illustrated, the functional package may contain electronic components such as the components or devices 31 mounted on the printed circuit board 32. As best illustrated in FIG. 2, the machine or electronic typewriter 10 also includes a printed circuit board and the like 20 on which is mounted electronic components 21 and including a power supply 22. The power supply 22 receives its basic power from a line cord 13 and provides a source of DC power for both the circuit board 20 and the circuit board 32 housed in the functional package 30.

As shown in FIG. 2 complementary connector means are included for connecting the electronic components in the functional package to the components in the machine 10 and for providing power from the power supply 22 of the machine to the functional package 30. To this end and as shown in FIG. 2, the circuit board 32 in the functional package 30 includes a card edge connector 33 which is pluggable into a raised card edge female connector 23 projecting upwardly into the cavity 16 and for mating engagement with the connector 33.

In accordance with the invention, the functional package 30 may be plugged into and removed from the machine 10 only when the power cord or line cord 13 is removed from the machine 10 to thereby prevent damage to the electronic components 21, 31 of either the functional package 30 or the machine 10. To this end, and as illustrated in FIGS. 2-5, when the line or power cord 13 is not inserted, as when the plug end 13a is not inserted into the receptacle 14 on the machine, the functional package 30 may be received in the cavity 16. When the functional package 30 is inserted into the cavity 16, hooks 34 and 35 on the back surface 36 of the functional package engage openings 24, 25 respectively on the interior rear surface 26 of the cavity 16 so as to mechanically hold the functional package 30 in position. Hooks 34 and 35 are located with respect to openings 24 and 25 to position the card edge connector 33 to mate with the female card edge connector 23. It should be noted that the hooks 34 and 35 form mechanical connecting means and are arranged with depending camming portions 34a, 35a such that they engage the lower edges 24a and 25a of the openings 24 and 25 to insure vertical insertion of the functional package 30. Of course other connection means may be provided to mechanically connect the functional package 30 in the cavity 16.

Assuming that the line cord has not been connected to the machine but the functional package 30 has been placed in its proper position in the cavity or recess defined by at least the wall 16a, and the card edge connector 33 has mated with the card edge connector female receptacle 23, the plug end 13a of the line cord 13 may then be inserted into the receptacle 14. As illustrated in FIGS. 3 and 4, the receptacle 14 includes at the base thereof projecting spade lugs or the like 14a which mate with conventional apertures in the plug end 13a for powering the machine 10. However, upon insertion of the plug end 13a into the receptacle 14, the plug end 13a engages a camming surface 41 located at the distal end portion of a bellcrank 40. The bellcrank 40 is pivoted in the machine as at 42 causing the bellcrank 40 to rotate as in the direction of the arrow 43 to overcome the biasing action of the spring 44. The bellcrank has a first nested position such as illustrated in FIG. 3, but upon insertion of the plug end 13a of the line cord 13, effecting rotation of the bellcrank, the extended or remote end portion 45 of the bellcrank moves to a second extended position projecting from the machine such as shown in the dotted line position 45a.

As may be seen in FIG. 5, if the line cord has been inserted so as to engage the camming surface 41 and effect rotation of the extended end 45 of the bellcrank 40 from its first nested position to its second extended or exposed position, when insertion of that functional package 30 is attempted, the extended end 45 of the bellcrank 40 will engage the bottom 37 of the functional package 30. In this manner depression of the functional package into the cavity 16 is inhibited and the card edge connector 33 is prevented from coming into contact with the female card edge receptacle 23.

As illustrated best in FIGS. 3 and 4, the extended or remoted end 45 of the bellcrank 40 communicates with an opening 46, adjacent the bellcrank, and in the machine 10. The opening 46 is located in the wall 16a of the cavity 16 and is generally aligned with an aperture 36a in one wall 37a of the functional package 30. The aperture 36a defines one end of a laterally extending opening or path 38 which terminates in an aperture 36b in the wall 37b of the functional package 30.

Slidably housed or supported within the path 38 by supports 38a, 38b and nested within the functional package 30 is a locking or latch bar 50, the locking bar being biased as by a spring or the like 51 so as to rest substantially within the functional package 30 when the functional package 30 is being inserted or removed to and from the cavity or recess 16. For purposes which will become evident hereinafter, in the one sidewall 16b of the cavity 16 and aligned with the lock bar 50 and the aperture 36b is a second opening 47.

When the functional package 30 is placed in the cavity 16 such that the hooks 34 and 35 are engaged with the openings 24 and 25 in the rear wall 26 of the recess or cavity 16, and the card edge connector 33 is connected to the female connector 23, and the plug end 13a of the line cord 13 is inserted, rotation of the bellcrank 40 causes the remote or extended end 45 thereof to engage the terminal end 52 of the latch bar 50, overcoming the bias of the spring 51 and causing the bellcrank to be inserted into the aperture 36a associated with the wall 37a of the functional package. The motion of the latch bar 50 causes the latch bar to move inwardly into the opening 47 in the wall 16b thereby locking the functional package 30 into the machine 10. Thus the locking bar 50 as well as the extended or remote end 45 of the bellcrank 40 cooperate to inhibit removal of the functional package from the machine 10 until the plug end 13a of the line cord 13 is removed from its receptacle 14.

Accordingly, the present invention provides means dependent upon attachment of the line cord to a machine containing electrical components or electronic components for preventing the removal of a package of electrical components from the machine if the package is connected to the machine while preventing the connection of the functional package or package to the machine if the package is not connected thereto.

Although the invention has been described with a certain degree of particularity, it is understood that the present disclosure has been made only by way of example and that numerous changes in the details of construction and the combination and arrangement of parts may be made without departing from the spirit and scope of the invention as hereinafter claimed.

What is claimed is:

1. An electrical interlock for inhibiting the plugging and unplugging of a package containing electronic components when power is on in a machine, said machine having means for electrically connecting said package thereto, and an externally available power receptacle, said interlock comprising in combination:

a bellcrank mounted for rotation adjacent said power receptacle, said bellcrank including a remote and distal end portion, said distal end portion including a cam follower portion for engagement with the plug end of a line cord, and a first opening in said machine adjacent said remote end portion of said bellcrank;

means in said machine for receiving a pluggable package, said pluggable package including means defining a laterally extending aperture therein having a first end alignable with said first opening when said package is plugged into said machine;

a locking bar slidably disposed in said aperture in said package and including means to bias said locking bar in a first position at least substantially self contained within said pluggable package when the plug end of said line cord is disengaged from said power receptacle;

a second opening in said machine spaced apart from said first opening and aligned with a second end of said aperture in said package, whereby, upon insertion of the plug end of said line cord into said power receptacle, said cam follower portion of said bellcrank is engaged by said plug end causing rotation of said bellcrank and effecting engagement of said remote end portion of said bellcrank with said locking bar, causing said locking bar to move to a second position engageable in said second opening in said machine and locking said pluggable package in said machine.

2. An electrical interlock in accordance with claim 1 wherein said means for receiving a pluggable package in said machine comprises a cavity in said machine dimensioned for receipt of said package; and complementary electrical connector means in said cavity and said pluggable package for electrically connecting said pluggable package to said machine.

3. An electrical interlock in accordance with claim 2 including means on said pluggable package for mechanically connecting said pluggable package into said cavity.

4. An electrical interlock to inhibit the plugging and unplugging of a functional package containing electronic components respectively to and from a machine containing electronic components, said machine and functional package being powered by a common power supply receiving its basic power from a removable line cord, said line cord having a plug end for insertion into said machine, said interlock comprising;

means on said functional package for connecting said electronic components thereof to the components in said machine when the two are plugged together and for receiving power from the power supply of said machine;

means automatically actuable by engagement with said plug end of said line cord upon insertion of said plug end into said machine for preventing the removal of said functional package from the machine if said functional package is connected to said machine and for preventing the connection of said functional package to said machine if said function package is not connected to said machine;

said means automatically actuable by engagement with said plug end comprising an actuator operable between a first nested position interiorly of said machine when said line cord is not attached and a second extended position in which at least a portion of said actuator projects from said machine when said line cord is attached, said actuator including a bellcrank and means biasing said bellcrank into said first nested position, and said functional package including a path therethrough having a locking bar slidably mounted therein, said path being aligned with said actuator of said machine.

5. An electrical interlock in accordance with claim 4 including biasing means connected to said locking bar for biasing said locking bar at least substantially within said functional package.

6. An electrical interlock to inhibit at least the plugging of a functional package containing electronic components into a machine containing electronic components, said machine and functional package being powered by a common power supply receiving its basic function from a removable line cord having a plug end for insertion into a receptacle on said machine, said interlock comprising:

means on said functional package for connecting said electronic components thereof to the components in said machine when the two are plugged together and for receiving power from the power supply of said machine;

means automatically actuable by engagement with said plug end of said line cord upon attachment of said plug end to said machine for preventing the connection of said functional package to said machine if said functional package is not connected to said machine;

said means automatically actuable by engagement with said plug end including a bellcrank mounted for rotation in said machine, said bellcrank having a distal portion and a remote end portion, said distal portion being engageable by said plug end of said line cord to effect rotation of said bellcrank and cause said remote end portion to project from said machine whereby, upon attempted insertion of said functional package to effect connection of the electronic components thereof to the electronic components in said machine, said remote end potion of said bellcrank inhibits such plugging together of said functional package and said machine by interposition of said remote end portion between said functional package and said machine;

a locking bar slidably mounted in said functional package, said locking bar being aligned with the remote end portion of said bellcrank; and biasing means connected to said locking bar and said functional package for retaining said locking bar at least substantially within said functional package.

7. An electrical interlock in accordance with claim 6 wherein said locking bar extends transversely of said functional package and includes a first end and a remote end, said first end being aligned with the said remote end portion of said bellcrank and engageable thereby when said bellcrank is rotated by said line cord, and means in said machine for receiving the remote end of said locking bar when said bellcrank has been rotated by said line cord.

* * * * *